July 31, 1951 B. L. HAVENS 2,562,550
RINGING OSCILLATOR
Filed Dec. 29, 1948
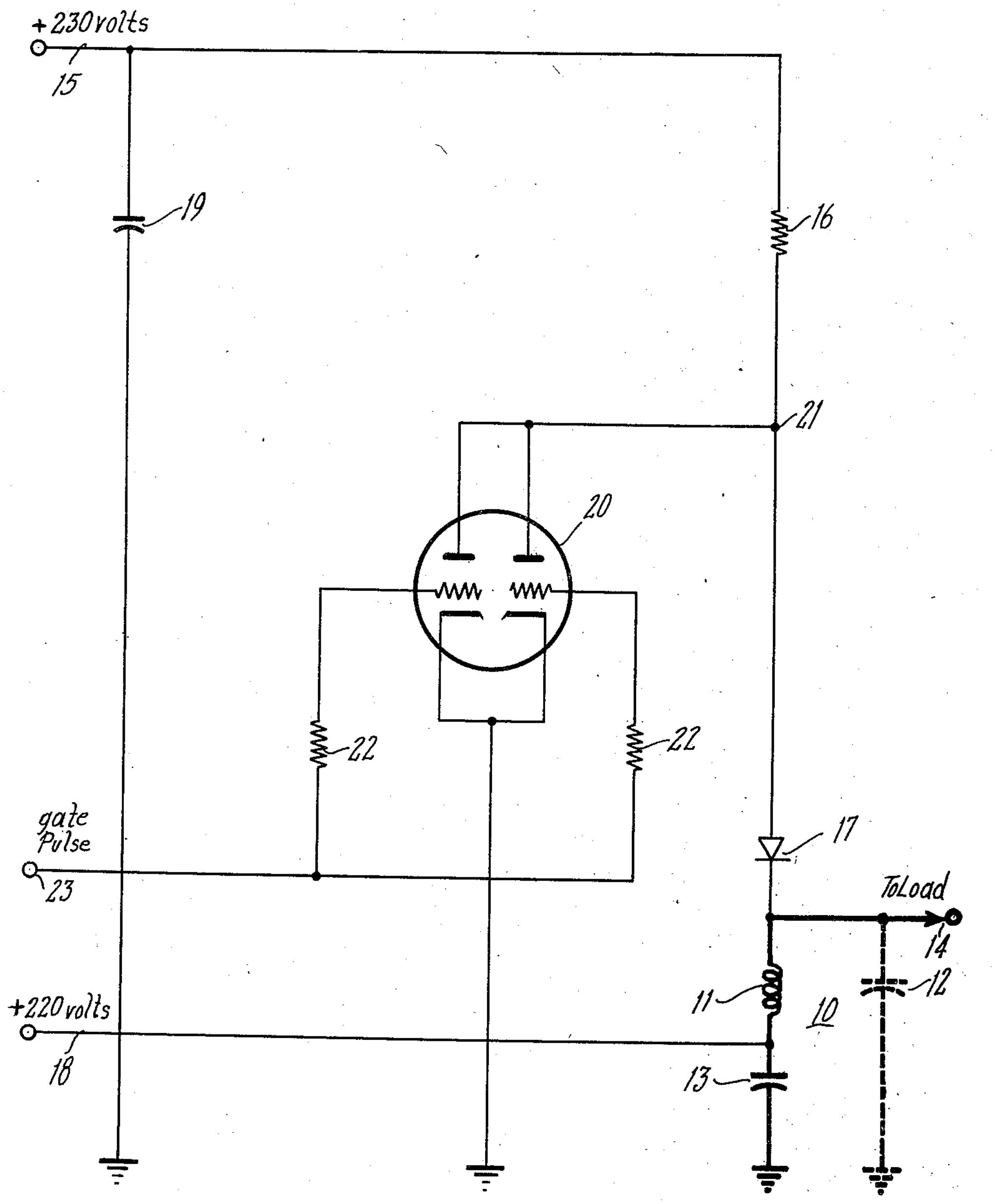
INVENTOR
Byron L. Havens
BY John R. Shipman
ATTORNEY Patented July 31, 1951 2,562,550

UNITED STATES PATENT OFFICE 2,562,550

RINGING OSCILLATOR

Byron L. Havens, Cresskill, N. J., assignor to International Business Machines Corporation, New York, N. Y., a corporation of New York Application December 29, 1948, Serial No. 67,992

6 Claims. (Cl. 250—36)

This invention relates to a ringing oscillator and has particular relation to a ringing oscillator adapted for use in supplying a pulse-modulated carrier wave to a load, such as an acoustic delay line.

In a conventional prior art ringing oscillator a vacuum tube is connected in a cathode follower circuit in which the load is a resonant LC tank circuit. The tube is used as a switch to interrupt a high plate current which causes the tank circuit to be shocked into oscillation. The tube is normally conducting practically at saturation plate current. The switching action of the tube is accomplished by applying a negative gate pulse to the grid of the tube through the action of a driver tube connected to the grid. When such a ringing oscillator is employed to supply a pulse-modulated carrier wave to an acoustic line as, for example, to a mercury delay line, the input crystal of the delay line is connected in the tank circuit. Then when the switch tube is cut off by a gate pulse, the tank circuit is shocked into oscillation and, during the period in which the gate pulse is applied, delivers a plurality of high frequency oscillations to the crystal. The output impedance of the cathode follower is sufficiently low to damp the circuit and stop the ringing oscillations when the gate pulse ends.

To secure maximum output from the tank circuit, it is necessary to have a relatively high current flowing through the tank circuit originally, which may be designated the "static" current. Consequently, as previously indicated, the tube in the cathode follower circuit is arranged to be conducting normally at practically saturation plate current. A relatively large tube is required to supply the necessary high static current. Consequently, there is a considerable power loss in the tube resulting in a rather poor efficiency. In addition, the efficiency of the ringing circuit varies inversely as the shunt capacitance across the tank circuit. The effective output capacitance of the cathode follower tube and its socket is sufficiently high to appreciably reduce the efficiency of the ringing circuit.

It is an object of my invention to provide a new and improved ringing oscillator.

Another object of my invention is to provide a novel ringing oscillator suitable for use in supplying pulse-modulated carrier waves to an acoustic delay line.

A further object is to provide an improved ringing oscillator in which the power consumption is substantially reduced.

A still further object is to provide a novel ringing oscillator in which the output efficiency is substantially increased.

Still another object is to provide a novel ringing oscillator in which the shunt capacitance across the tank circuit is substantially reduced.

It is another object to provide a new and improved ringing oscillator in which the power consumption and the shunt capacitance are both substantially reduced whereby an increased output is obtained with greater efficiency.

In accordance with my invention the switching tube is eliminated from the conventional ringing oscillator circuit and instead a diode rectifier and resistor circuit, together with a clamping tube, is employed to interrupt the normal current through the tank circuit. As will become apparent from a consideration of the details of the circuit, this arrangement provides a high output with greater efficiency because of a reduced power and a reduced shunt capacitance.

Other objects and advantages of the invention will be pointed out in the following description and claims and illustrated in the accompanying drawing, which discloses, by way of example, the principle of the invention and the best mode, which has been contemplated, of applying that principle.

In the drawing, the single figure is a schematic circuit diagram of a ringing oscillator circuit embodying my invention.

As shown in the drawing, the ringing oscillator is arranged to supply high frequency oscillations for a short period at spaced intervals of time to a suitable load, such as an acoustic delay line. The ringing oscillator includes an LC tank, or series ringing, circuit 10 comprising an inductive coil 11 and the effective input capacitance of the load represented by the capacitor 12, in dotted lines on the drawing, connected from the upper end of the coil 11 to the ground. In the case of an acoustic line load this input capacitance comprises the stray capacitance and the shunt capacitance of the input crystal. The series ringing circuit is completed by a low impedance blocking condenser 13 connected from the lower end of the coil 11 to the ground. The tank circuit 10 is tuned to resonance at the desired frequency and an output terminal 14 is connected to the upper end of coil 11 for connection to the load.

Static current is normally supplied to the tank circuit 10 from a suitable +230 volts supply line 15 through a relatively small resistor 16, a rectifier 17, and the tank circuit 10 to a +220 volts supply line 18 connected to a point intermediate the coil 11 and condenser 13. The rectifier 17 is preferably a dry diode rectifier as, for example, a germanium crystal diode, such as a Sylvania 1N34 diode. A filter capacitor 19 is connected from the +230 volts line 15 to ground.

A clamping tube 20 is provided and is preferably a twin triode tube, such as an RCA 12AT7 tube. The anodes of the clamping tube 20 are connected together and to a junction point 21 between the resistor 16 and the rectifier 17. The cathodes of the clamping tube 20 are connected together and to the ground. The control grids of the clamping tube 20 are connected through individual resistors 22 to a terminal 23 through which a gate voltage pulse is supplied from a suitable source. The source of gate pulses is arranged so that the grids of the clamping tube 20 are normally below cut off and are raised above cut off by a gate pulse so that the clamping tube is conductive only during a period in which a gate pulse is supplied.

In considering the operation of the ringing oscillator, it is evident that with the clamping tube 20 non-conductive, static current flows from the +230 volts supply line 15 through the resistor 16, the rectifier 17 and the coil 11 to the +220 volts supply line 18. The resistor 16 is relatively small so that in conjunction with the forward resistance of the rectifier 17, it causes the tank circuit to be critically damped. Since the clamping tube 19 is normally non-conductive, and the potential drop across the rectifier 17 during conduction in a forward direction is very low and the resistor 16 is small, there is but a very low power consumption.

When a gate pulse is supplied to the grids of the clamping tube 20, that tube becomes highly conductive and it pulls the voltage level of point 21 down to interrupt the flow of current through the rectifier 17 and the coil 11, causing the tank circuit 10 to be shocked into oscillation. Since the voltage level of point 21 is low, the tank circuit 10 sees only the back resistance of the rectifier 17 which is sufficiently high to prevent serious damping of the oscillations produced in the tank circuit. The shunt capacitance across the rectifier 17 is rather small, being considerably less than the effective output capacitance of the cathode follower tube in the prior art conventional arrangement previously described. As a result, the efficiency of the ringing oscillator is quite high and maximum output oscillations are supplied to the load, with but a very slight damping, throughout the duration of the gate pulse, the oscillations being damped by the load loss but not by the supply circuit.

When the gate pulse is removed, the tube 20 becomes non-conductive and the low resistance of the resistor 16 and the forward resistance of the rectifier 17 again causes the tank circuit 10 to be critically damped and the flow of static current is resumed.

In a typical oscillator constructed in accordance with the drawing for supplying an acoustic delay line load, the tube 20 was an RCA 12AT7 tube; the resistor 16 was a 470 ohm, 1 watt resistor; the resistors 22 were 100 ohm resistors; the rectifier was a 1N34 diode; the capacitors 13 and 19 were each a .01 mf. condenser; and the tank circuit was tuned to resonance at a frequency of eight megacycles per second.

It will be understood that the +230 volts and +220 volts supply lines are only typical and other suitable voltages may be employed. In some cases, it may be desirable to have the supply line 18 at ground level and in such case the blocking condenser 13 may be omitted.

While there have been shown and described and pointed out the fundamental novel features of the invention as applied to a preferred embodiment, it will be understood that various omissions and substitutions and changes in the form and details of the device illustrated and in its operation, other than those already pointed out, may be made by those skilled in the art without departing from the spirit of the invention. It is the intention, therefore, to be limited only as indicated by the scope of the following claims:

What is claimed is:

1. A ringing oscillator comprising a resonant LC tank circuit, a rectifier, a resistor, said resistor, rectifier and tank circuit being connected in series in the order named from a first to a second voltage supply line with the rectifier offering its lower resistance to current flow from the first line, said first line having a more positive voltage level than the second whereby a static current normally flows through the tank circuit, and means connected to the junction between said resistor and rectifier and operable to lower the voltage level of said junction below that of said second line to interrupt said static current and thereby cause oscillations to be established in the tank circuit.

2. A ringing oscillator comprising a resonant LC tank circuit, a rectifier, a resistor, said resistor, rectifier, and tank circuit being connected in series in the order named between a first and a second voltage supply line with the rectifier offering its lower resistance to current flow from the first line, said first line having a more positive voltage level than the second whereby a static current normally flows through the tank circuit, a clamping tube connecting the junction between said resistor and rectifier to a voltage supply terminal having a lower voltage level than said second line, and means for causing the clamping tube to become conductive to interrupt said static current and thereby cause oscillations to be established in the tank circuit.

3. A ringing oscillator comprising a tank circuit including an inductive coil and a capacitor connected in circuit across said coil, said coil and capacitor being tuned to series resonance at a selected frequency, a rectifier, a resistor, a first voltage supply line, a second voltage supply line having a voltage level negative relative to that of the first line, said resistor and rectifier being connected in series in the order named from said first line to one end of said coil, with the rectifier offering its lower resistance to current from said first line, the other end of the coil being connected to said second line whereby a static current normally flows through the coil, and means connected to the junction between said resistor and rectifier and operable to lower the voltage level of said junction below that of said second line to interrupt said static current and thereby cause oscillations at said selected frequency to be established in the tank circuit.

4. A ringing oscillator comprising a resonant tank circuit including an inductive coil and a capacitor connected in circuit across said coil, a rectifier, a resistor, said resistor, rectifier and coil being connected in a series circuit in the order named between a first and a second voltage supply line with the rectifier offering its lower resistance to current flow from the first line, said first line having a more positive voltage level than the second whereby a static current normally flows through the coil, a clamping tube connecting the junction between said resistor and rectifier to a voltage supply terminal having a lower voltage level than said second line, and means for causing the clamping tube to become conductive to interrupt said static current and thereby cause oscillations to be established in the tank circuit.

5. A ringing oscillator comprising a resonant tank circuit including an inductive coil and a capacitor connected in circuit across said coil, a rectifier, a resistor, said resistor, rectifier and coil being connected in series in the order named between a first and second voltage supply line with the rectifier offering its lower resistance to current flow from the first line, said first line having a more positive voltage level than the second whereby a static current normally flows through the coil, a clamping tube connecting the junction between said resistor and rectifier to a voltage supply terminal having a lower voltage than said second line, and control means for said tube normally maintaining it non-conductive but effective during selected spaced intervals to cause the tube to be conductive to interrupt said static current and thereby cause oscillations to be established in the tank circuit in each of said intervals.

6. A ringing oscillator comprising a resonant LC tank circuit, a rectifier having a low forward resistance and a high back resistance, a resistor, means connecting said resistor, rectifier and tank circuit in series in the order named from a first to a second voltage supply line with the rectifier offering its forward resistance to current from the first line, said first line having a more positive voltage level than the second line whereby a static current normally flows through the tank circuit, the combined resistance of said resistor and forward resistance of the rectifier being of a low value causing the tank circuit to be critically damped during the flow of static current, and means connected to the junction between said resistor and rectifier and operable during selected intervals to lower the voltage level of said junction below that of said second line to interrupt the static current and thereby cause oscillations to be established in the tank circuit throughout each interval, the high back resistance of the rectifier preventing the tank circuit from being critically damped during said intervals.

BYRON L. HAVENS.

REFERENCES CITED

The following references are of record in the file of this patent:

UNITED STATES PATENTS

| Number | Name | Date |
| --- | --- | --- |
| 2,370,685 | Rea | Mar. 6, 1945 |
| 2,442,769 | Kenyon | June 8, 1948 |